United States Patent [19]
Palma

[11] Patent Number: 5,422,440
[45] Date of Patent: Jun. 6, 1995

[54] LOW INDUCTANCE BUS BAR ARRANGEMENT FOR HIGH POWER INVERTERS

[75] Inventor: Rudolfo Palma, Troy, N.Y.

[73] Assignee: REM Technologies, Inc., Schenectady, N.Y.

[21] Appl. No.: 73,744

[22] Filed: Jun. 8, 1993

[51] Int. Cl.$^6$ ............................................. H01B 5/02
[52] U.S. Cl. ........................... 174/133 B; 174/70 B; 174/99 B; 361/611; 361/637; 361/648
[58] Field of Search ............. 174/133 B, 129 B, 99 B, 174/70 B; 361/611, 637, 648

[56] References Cited

U.S. PATENT DOCUMENTS

| | | |
|---|---|---|
| 2,968,781 | 1/1961 | Staskowski . |
| 2,985,710 | 5/1961 | Davis et al. ................ 174/99 B |
| 2,989,579 | 6/1961 | Somes, Jr. ................ 174/99 B |
| 3,091,655 | 5/1963 | DeRuiter ..................... 174/32 |
| 3,402,254 | 9/1968 | Parker et al. ............. 174/133 B |
| 3,459,880 | 8/1969 | Erdle ........................ 174/117 |
| 3,550,269 | 12/1970 | Yatabe et al. ............... 29/264 |
| 3,634,810 | 1/1972 | Pemberton .............. 339/22 B |
| 3,636,237 | 1/1972 | Hafer ....................... 174/68 B |
| 3,852,515 | 12/1974 | Jorgensen et al. ......... 174/88 B |
| 4,159,504 | 6/1979 | Cook ........................... 361/361 |
| 4,180,845 | 12/1979 | Shariff et al. ............... 361/334 |
| 4,288,656 | 9/1981 | Olashaw ................... 174/71 B |
| 4,603,345 | 7/1986 | Lee et al. ..................... 357/81 |
| 4,809,153 | 2/1989 | Bremer et al. ............... 363/141 |
| 5,053,918 | 10/1991 | Norden .......................... 361/355 |

FOREIGN PATENT DOCUMENTS

| | | | |
|---|---|---|---|
| 2131307 | 5/1990 | Japan .......................... 361/341 |
| 0215008 | 8/1990 | Japan .......................... 174/133 B |
| 746367 | 3/1956 | United Kingdom ............. 174/99 B |

OTHER PUBLICATIONS

Bovaconti, P., East, D. and McCrief, A.; Low-Noise Electrical Bus; *IBM Technical Disclosure Bulletin;* vol. 17, No. 10; Mar. 1975; p. 2982.

Primary Examiner—Morris H. Nimmo
Attorney, Agent, or Firm—Heslin & Rothenberg

[57] ABSTRACT

A low inductance bus bar arrangement suitable for industrial voltage levels, and for power applications contains two or more elongate electrical conducting bars having rounded edges. Strips of dielectric insulating material are located between two of the elongate electrical conducting bars. The conducting bars are oriented in substantially parallel relationship to one another with the dielectric insulating material having a height of the cross-section thereof substantially greater than the height of the cross-section of the conducting bars. The bus bar arrangement also provides low inductance to the connecting devices.

25 Claims, 6 Drawing Sheets

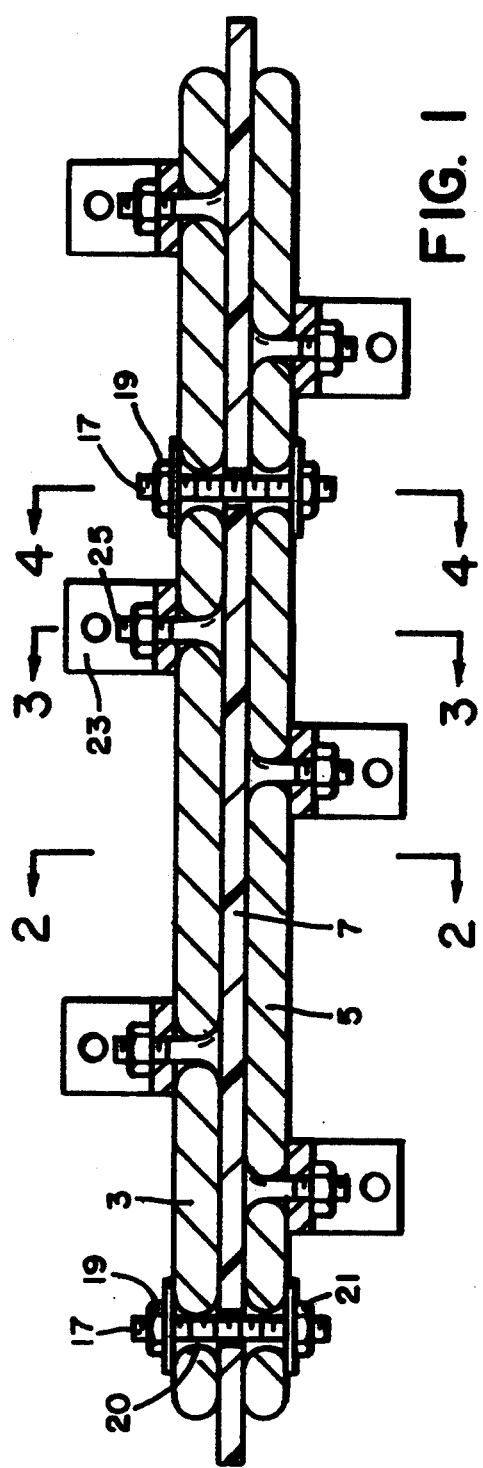
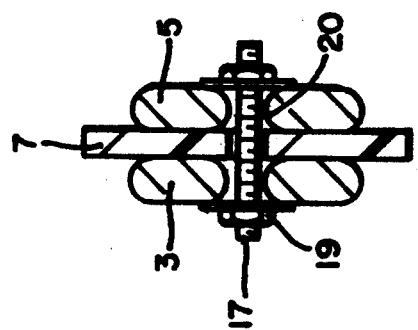
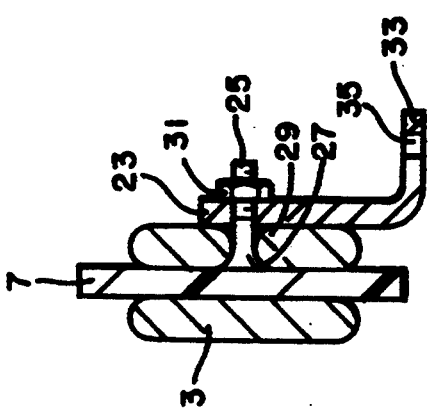
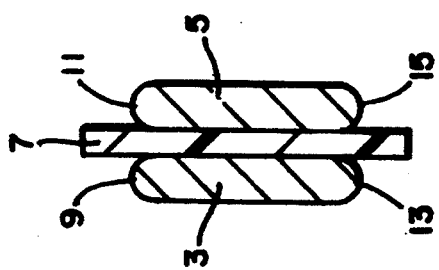

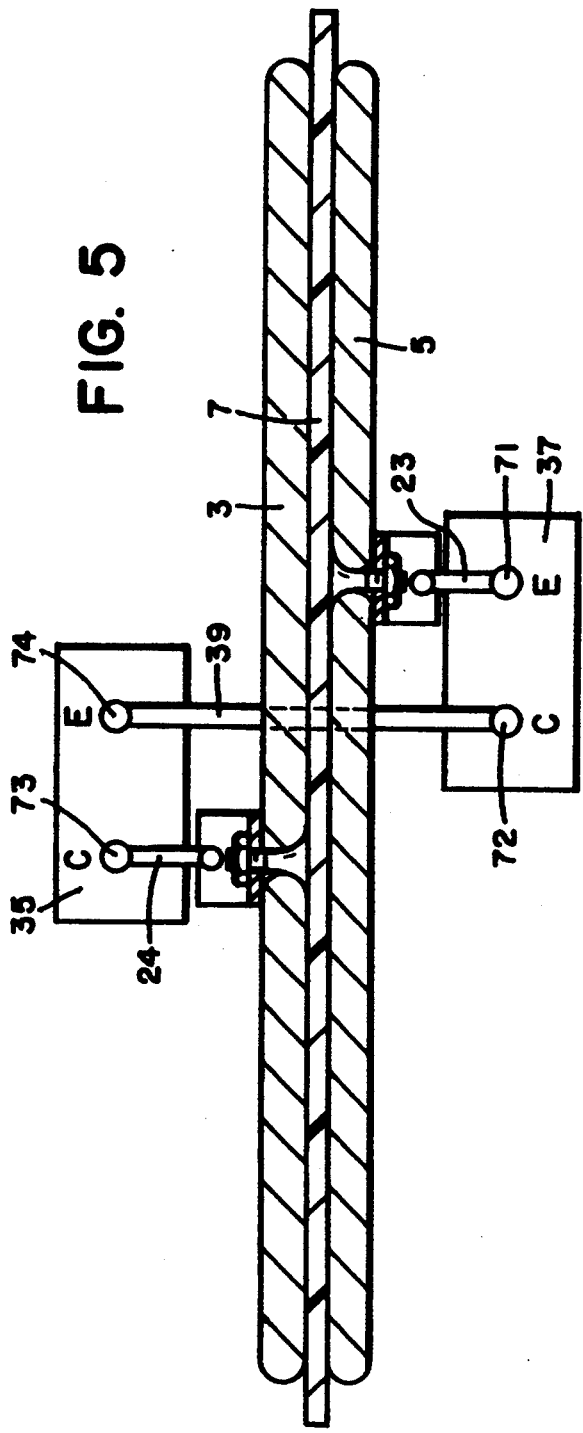

LOW INDUCTANCE BUS BAR ARRANGEMENT FOR HIGH POWER INVERTERS

BACKGROUND OF THE INVENTION

The present invention relates to the field of bus bar arrangements, and, more particularly, to a low inductance bus bar arrangement utilizing elongate bus bars vertically oriented and separated by one another with an insulating material.

From Bremer, et al., U.S. Pat. No. 4,809,153, a modular bus bar arrangement utilizing elongated vertically oriented bus bars separated by an insulating material therebetween is shown. The relationship between the inductance of the bus bar assembly and the orientation of the individual bars is taught to be proportional to the distance between the individual bars divided by the height of the bars. Therefore, it is suggested that the inductance of the bus bar assembly can be minimized by decreasing the distance between the individual bus bars and/or increasing the height of the bus bars. However, one problem with decreasing the inductance of the bus bar assembly by decreasing the distance between bars is that the propensity for arcing t between individual bars of different potential is greatly increased.

Bus bars of low inductance are commonly used in inverters operating at high switching frequencies and high power. A low inductance bus bar allows an inverter to operate reliably by reducing the propensity for voltage spikes and by reducing electromagnetic noise emanated by the bus bar. Moreover, low inductance bus bars reduce the likelihood that snubber circuits will be required on power modules for the bus bars.

In order to maintain a low inductance between the conductors of bus bars, the bus bars must be supported in a fixed position. However, the use of certain fastening means such as machine screws to support the conductors of the bus bars tends to create high electric field gradients which create points prone to dielectric failure in high and medium voltage applications. This dielectric failure could result in the destruction of the whole equipment.

It is also desireable to provide a system for connecting various electrical devices such as switching power modules to the bus bar assembly without increasing the inductance of the bus bar assembly and without creating regions of dielectric stress on the bus bar assembly and any connections thereto.

It is therefore an object of the present invention to provide a bus bar assembly which minimizes the inductance inherent therein without creating a situation where arcing between bus bars of different potential is facilitated.

It is also desireable to provide such a low inductance bus bar assembly which is capable of being connected to various electrical connections maintaining the dielectric integrity, as well as providing low inductance to the connected devices. Finally, the bus bar assembly should be able to provide the current carrying capabilities required, within the thermal and mechanical limits set by the materials and the equipment.

SUMMARY OF THE INVENTION

The aforementioned advantages and objects may be best achieved by implementation of a low inductance bus bar arrangement constructed in accordance with the principles of the present invention.

The low inductance bus bar arrangement includes two or more elongate electrical conducting bars having rounded edges, and one or more strips of dielectric insulating material, each being located between two of said elongate electrical conducting bars, the strips of dielectric insulating material having a height of the cross-section thereof being substantially greater than the height of the cross-section of the elongate electrical conducting bars. The elongate electrical conducting bars should have their sides facing one another and may have their heights substantially vertically oriented. The low inductance bus bar assembly may also include apertures extending through the electrical conducting bars and strips of dielectric insulating material; a fastening means may extend through the apertures to hold the conducting bars and strips of dielectric insulating material in a fixed position.

The low inductance bus bar arrangement may also include one or more connecting feet affixed to each of the conducting bars by a fastener inserted through an aperture within the conducting bar. The fastener may have a head being recessed within the aperture of the conducting bar and protruding through the aperture and through another coaxial aperture within the particular connecting foot. The fastener head may contain rounded edges.

A connecting foot connected to one of the conducting bars may be electrically connected to a first switching power device and the second connecting foot connected to another of said conducting bars may be connected to a second switching power device. Each switching power device has a collector contact point and an emitter contact point. The emitter contact point of a first switching power device and the collector contact point of the second switching power device may be oriented such that a conductor line extending directly therebetween is substantially perpendicular to the conducting bars.

The bus bar arrangement may also contain at least three elongate electrical conducting bars, two of the conducting bars may be at the same electric potential and connected to each other by a U-shaped conducting means integrally formed to the two electrical conducting bars. A connecting foot may be affixed to the U-shaped conducting means. A dielectric insulating material should also be located between the U-shaped conducting means and the third of the conducting bars.

The low inductance bus bar assembly may include a pair of elongate electrical conducting bars having rounded edges being embedded within and separated by a thermoplastic dielectric resin insulating material. A screw terminal may be located within the thermoplastic dielectric resin having a threaded aperture within the resin the aperture may be coaxial with and extend into an identically threaded aperture within one of the pair of elongate electrical conducting bars.

The low inductance bus bar assembly may also include at least three elongate electrical conducting bars having rounded edges thereon. A first of the three conducting bars may be oriented between and parallel to a second and third conducting bar. The second and third conducting bars being of similar electric potential and being connected by a substantially perpendicular section integrally formed with the second and third conducting bars thereby forming a C-shaped conducting means.

The low inductance bus bar arrangement may be assembled wherein the first conducting bar is oriented between and parallel to the second and third conducting bars. The first conducting bar may be connected to a fourth conducting bar by an integrally formed substantially perpendicular section, said fourth conducting bar being substantially parallel to said second and third conducting bars, wherein said first and fourth conducting bars and said perpendicular section integrally formed therewith form a second C-shaped conducting means.

The low inductance bus bar arrangement may further include a fifth elongate conducting bar substantially parallel to the third conducting bar and connected thereto by a perpendicular section integrally formed with the third and fifth conducting bars. The second, third and fifth conducting bars and perpendicular sections integrally formed therewith form a first E-shaped conducting means.

A sixth elongate conducting bar may be substantially parallel to the first conducting bar and be connected thereto by a perpendicular conducting section integrally formed with the sixth and first conducting bars. The sixth, first and fourth conducting bars and perpendicular sections formed therewith may form a second E-shaped conducting means which is oppositely opposed and oriented complimentary to the first E-shaped conducting means. The edge of the fifth conducting bar opposite the perpendicular conducting section integrally formed thereto may be approximately even with an outer face of the second E-shaped conducting means.

The edge of the sixth conducting bar opposite the perpendicular conducting section integrally formed thereto may be approximately even with an outer face of the first E-shaped conducting means.

A pair of electrical conducting bars being at the same electric potential may be connected to each other by a U-shaped conducting means integrally formed to the pair of electrical conducting bars. A connecting foot may be affixed to said U-shaped conducting means.

The low inductance bus bar arrangement may have the elongate electrical conducting bars surrounded by a casing.

BRIEF DESCRIPTION OF THE DRAWINGS

The invention will be best understood by reference to the following detailed description when read in conjunction with the drawings, in which:

FIG. 1 is a sectional plan view of a bus bar assembly constructed in accordance with the principles of the present invention;

FIG. 2 is a cross-sectional view of the bus bar assembly depicted in FIG. 1 taken along line 2—2; FIG. 3 is a cross-sectional view of the bus bar assembly depicted in FIG. 1 taken along line 3—3; FIG. 4 is a cross-sectional view of the bus bar assembly depicted in FIG. 1 taken along line 4—4; FIG. 5 is a plan view of a bus bar assembly constructed in accordance with the principles of the present invention as shown in FIGS. 1 through 4 having switching power devices connected thereto and mounted in a shifted mounting arrangement in order to minimize the bar to device inductance;

FIG. 6 depicts a schematic representation of the bus bar assembly and switching power devices depicted in FIG. 5;

DETAILED DESCRIPTION

Figure 7:
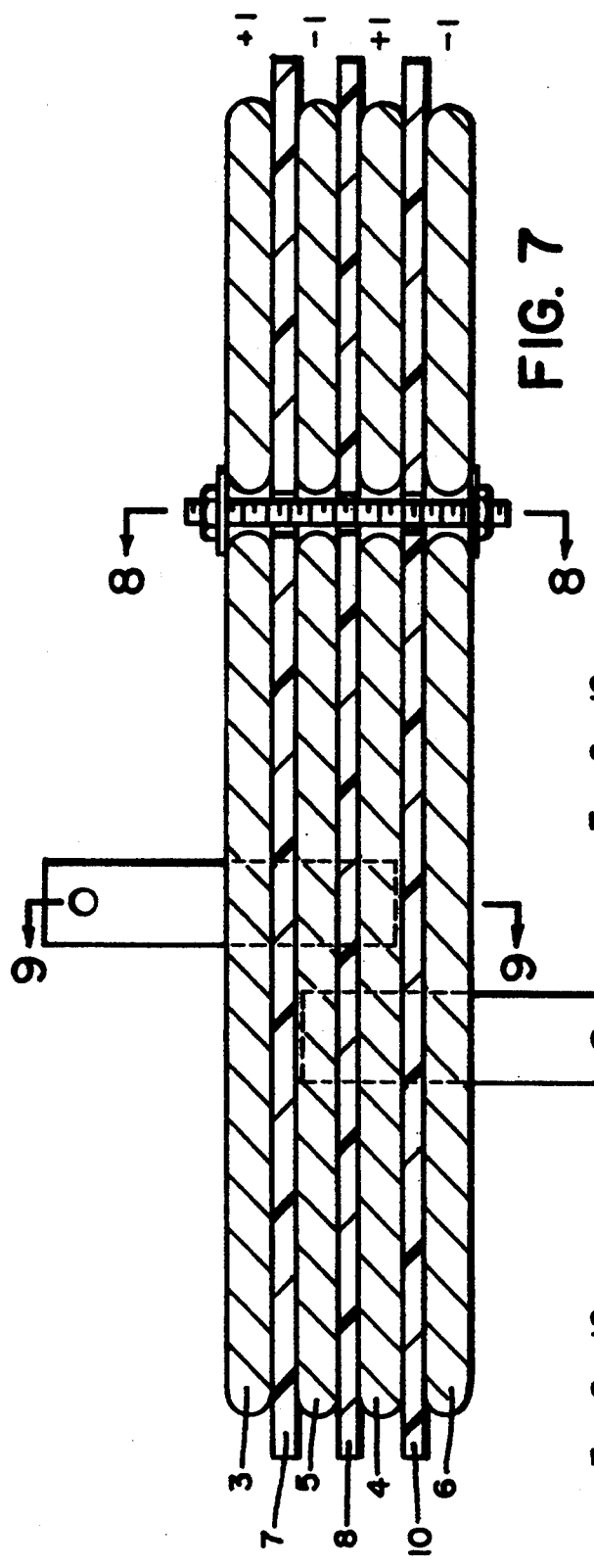
FIG. 7 depicts a top view of an alternative embodiment of a bus bar assembly constructed in accordance with the principles of the present invention.

As constructed in accordance with the principles of the present invention, a low inductance bus bar arrangement includes two or more elongate electrical conducting bars with a dielectric insulating material located therebetween.

Referring to FIGS. 1, 2, 3 and 4, one embodiment of the bus bar arrangement constructed in accordance with the principles of the present invention is shown. The elongate electrical conducting bars 3, 5 are oriented such that they extend lengthwise substantially parallel to and with their flat sides facing one another. Each elongate electrical conducting bar 3, 5 contains rounded edges, shown in FIG. 2, 9, 11, 13, 15 thereon. A dielectric insulating material 7 also being elongate is positioned in between the electrical conducting bars 3, 5. As shown in FIG. 2, the height of the dielectric insulating material 7 is greater than the height of electrical conducting bars 3, 5. Also, as shown in FIG. 1, the length of the dielectric insulating material is greater than the length of the electrical conducting bars 3, 5. The length and height of the insulating material could be sufficiently large to prevent arcing between the conducting bars. The conducting bar 3 is at a different electric potential than conducting bar 5. Typically one conducting bar is designated with a positive polarity with the other bar designated with a negative polarity. Because of the height of the dielectric insulating material 7, current flow through an arc between conducting bars would have to travel above the height of the dielectric material 7. Arcing between the electrical conducting bars 3, 5 may therefore be minimized by using a relatively higher dielectric insulating material 7. The height of the dielectric insulating material 7 enables the elongate electrical conducting bars 3, 5 to be placed at a relatively closer distance to one another without arcing occurring therebetween. The inductance between the elongate electrical conducting bars 3, 5 may therefore be minimized because the distance between the electrical conducting bars, i.e., the thickness of the dielectric insulating material 7, can be decreased while the height of the electrical conducting bars are increased. Also, because the length of the dielectric insulating material is greater than the length of the electrical conducting bars 3, 5 arcing occurring at the ends of the conducting bars is also minimized.

Referring again to FIG. 1, the bus bar assembly includes a fastening means such as a threaded fastener or rod 17 and a pair of nylon nuts 19, 21, threaded thereon. The threaded fastener or rod 17 and nuts 19, 21 are made of a non conductive material such as plastic or nylon. The threaded fastener or rod 17 is inserted through an aperture 20 which extends coaxially through an elongate electrical conducting bar 3, the dielectric insulating material 7 and elongate electrical conducting bar 5. Referring to FIG. 4, the aperture 20 has a chamfered inner face facing the insulating material 7. Additional fastening means may be located along various points throughout the length of the bus bar arrangement to maintain the electrical conducting bars 3, 5 and the dielectric insulating material 7 in their proper position. Fastening means other than threaded rods or bars may also be used and the invention is not intended to be limited to any particular fastening technique.

The elongate electrical conducting bars may be electrically connected to various electrical devices by one or more connecting feet 23. Referring to FIG. 3, a connecting foot 23 is affixed to one of the elongate electrical conducting bars 5 by a fastener 25 having a head 27 thereof being recessed within an aperture 29 of the electrical conducting bar 5. The fastener head 27 should be mounted flush with the inner surface of the electrical conducting bar as shown in FIG. 3. Preferably, in order to prevent the formation of a hot spot, the fastener head may be rounded at the edges thereof. The fastener 25 extends through an aperture within the connecting foot coaxial with the aperture 29 of the electrical conducting bar and is threaded into a nut 31 thereby affixing the connecting foot 23 to the electrical conducting bar 5. The connecting foot 23 contains a base portion 33 having a means for connecting an electrical device, such as an aperture 35 therein. Typically, the connecting foot 23 is substantially L-shaped.

Referring to FIG. 5, the bus bar assembly has an elongate electrical connecting bar 3 at a positive polarity and an elongate electrical connecting bar 5 at a negative polarity each connected to a pair of switching power devices 35, 37. Switching power device 37 is connected by a connecting foot 23 at the emitter point 71 to elongate electrical conducting bar 5. Another switching power device 35 is connected at its collector point 73 by connecting foot 24 to the opposite elongate electrical conducting bar 3. The switching power devices 35, 37 are mounted in shifted mounting arrangement such that the collector 72 of switching power device 37 is connected to the emitter 74 of switching power device 35 by a conductor 39 which is substantially perpendicular to the conducting bars 3, 5. This shifted mounting arrangement provides for a minimum inductance between the collector 72 of switching power device 37 and the emitter 74 of switching power device 35, as well as minimum inductance between the bus bars and the terminals of the devices, as shown in FIG. 6.

Figure 9:
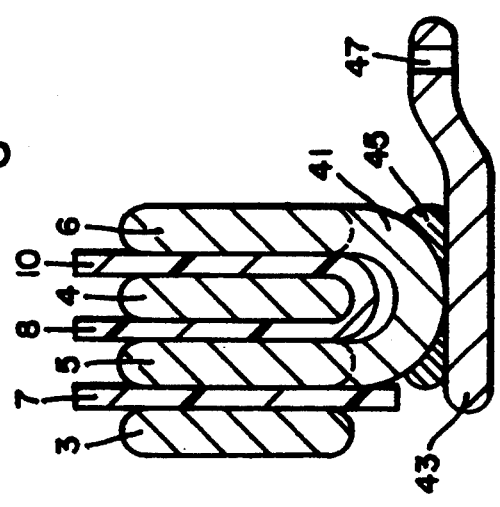
FIG. 9 depicts a cross-sectional view of the bus bar assembly depicted in FIG. 7 taken along line 9—9.
Figure 8:
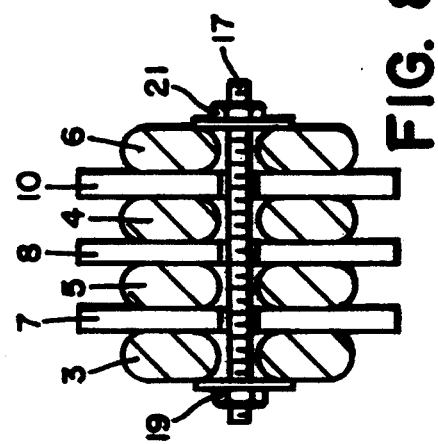
FIG. 8 depicts a cross-sectional view of the bus bar assembly depicted in FIG. 7 taken along line 8—8.
Figure 10:
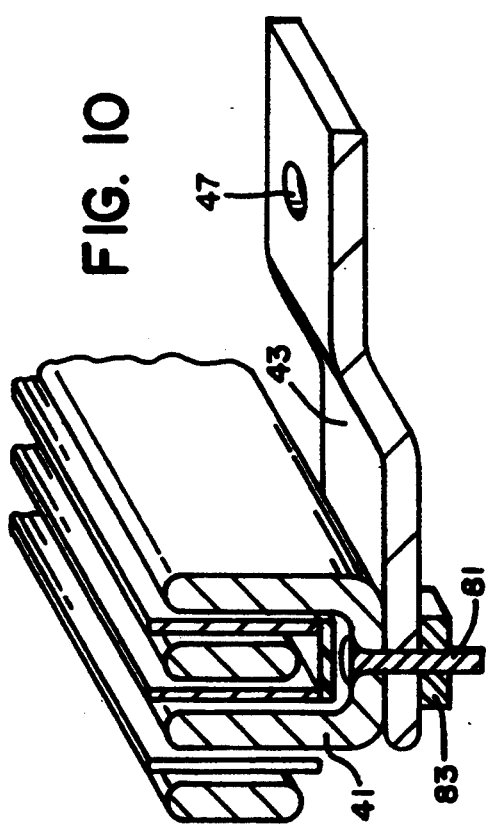
FIG. 10 depicts an isometric view of the bus bar assembly of FIG. 9 having an alternative means for affixing a connecting foot thereto.

The bus bar assembly constructed in accordance with the principles of the present invention is not limited to any particular number of elongate electrical conducting bars. FIGS. 7, 8 and 9, depict a bus bar assembly having four elongate electrical conducting bars 3, 4, 5, 6. Electrical conducting bars 3, 4 may be at a first electric potential (i.e., positive polarity) while conducting bars 5 and 6 may be at a second electric potential (i.e., negative polarity) which is different than the first potential. Located between each elongate conducting bar 3, 5, 4, 6, are pieces of dielectric insulating material 7, 8 and 10. Each piece of dielectric insulating material should have a height which is greater than the height of the conducting bars affixed thereto. A threaded fastener or rod 17 similar to that depicted in FIG. 4, and as shown in FIG. 7, may be used to position the elongate electrical conducting bars 3, 4, 5, 6 and dielectric insulating material 7, 8, 10. Pairs of conducting bars of the same potential such as conducting bars 5, 6, may have a U-shaped conducting means 41 integrally formed to the bottom portion of each electrical conducting bar 5, 6 at a specific location along the length of the bus bar assembly to enable a modified connecting foot 43 to be connected therebetween. The dielectric insulating material 8, 10 may integrally form into a U-shape thereby insulating conducting bar 4 from the U-shaped conducting means 41. The modified connecting foot 43 may be connected to the bottom of the U-shaped conducting means 41 by a weld 45. Alternatively, as shown in FIG. 10, a fastener 81 and nut 83 may be used to affix the U-shaped conducting means 41 to the modified connecting foot 43. The modified conducting foot 43 may contain a means, such as an aperture 47, for connecting the connecting foot to an electrical device such as a switching power device or power module. For convenience as shown in FIG. 9, the end of the modified connecting foot 43 having the aperture 47 therein may be offset so as to be mounted on the top of an electrical device (not shown).

Figure 11:
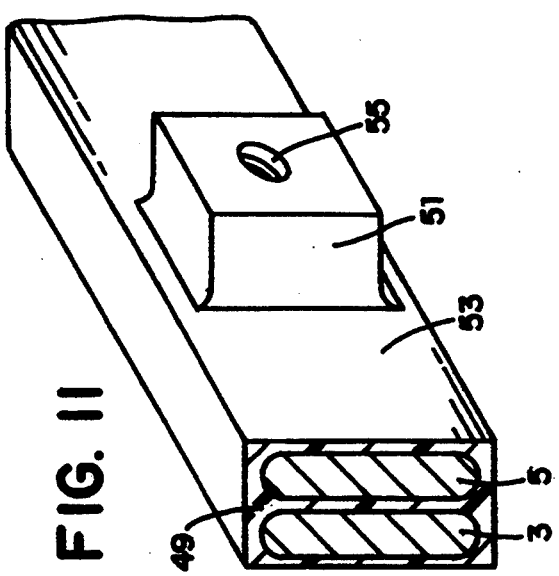
FIG. 11 depicts an isometric view of yet another embodiment of a bus bar assembly constructed in accordance with the principles of the present invention being embedded within a thermoplastic resin.

Referring now to FIG. 11, the electrical conducting bars 3, 5 may be embedded within a thermoplastic resin dielectric insulating material 49. The conducting bars 3, 5 are separated, and completely surrounded by the dielectric insulating material 49. For convenience, a screw terminal 51 may be located on a side face 53 of the bus bar assembly. The screw terminal may be constructed of the thermoplastic resin dielectric insulating material 49 and may contain a threaded aperture 55 therein leading to an electrical conducting bar 5 to enable a connecting foot to be connected to the screw terminal 51 by a screw-type fastening means. A screw, for example, may be threaded within the aperture 55 in such a manner that the threads thereof contact the elongate electrical conducting bar 5. Alternatively, the screw may be threadable within a coaxial threaded aperture within the conducting bar 5.

Figure 12:
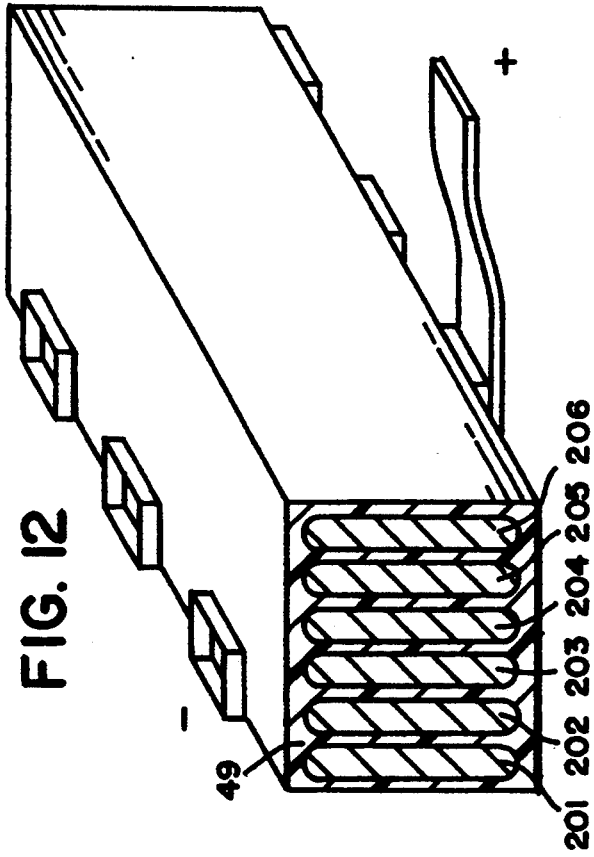
FIG. 12 depicts an isometric view of an alternative embodiment of the bus bar assembly constructed in accordance with the principles of the present invention having a plurality of bus bars therein embedded within a thermoplastic resin.
Figure 15:
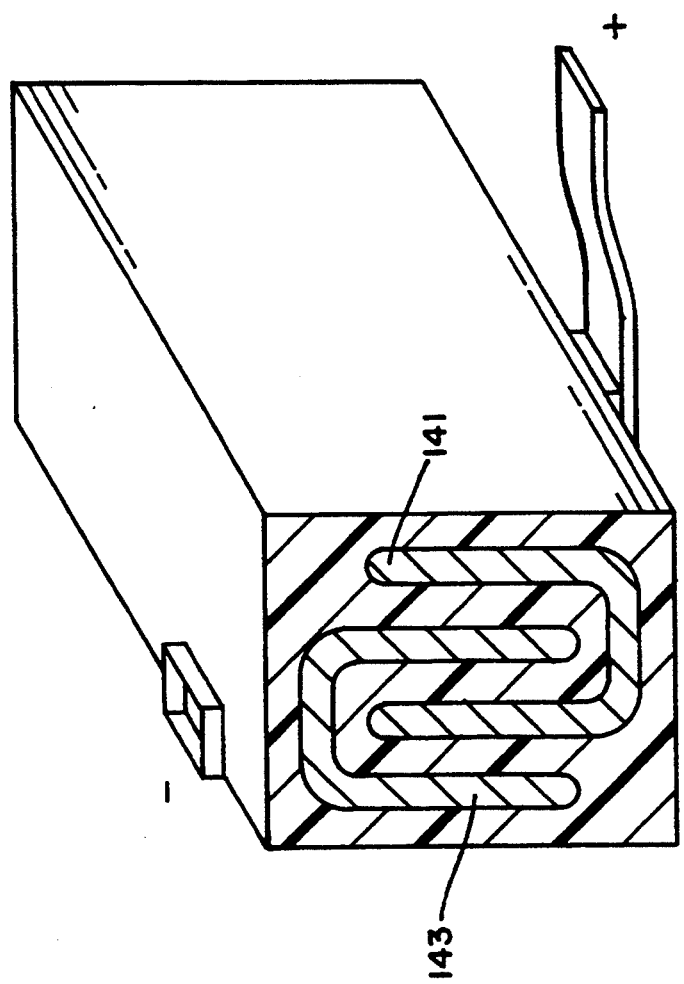
FIG. 15 depicts an isometric view of an alternate embodiment of the bus bar assembly constructed in accordance with the principles of the present invention having two complimentary U-shaped conducting means embedded within a thermoplastic resin.

As shown in FIG. 12, more than two electrical conducting bars may be embedded within the thermoplastic resin dielectric insulating material 49. FIG. 12, depicts a bus bar assembly having six elongate electrical conducting bars 201, 202, 203, 204, 205, 206. Three conducting bars 201, 203, 205 are at a first potential while the other three conducting bars 202, 204, 206 are at a second electric potential. As shown in FIG. 15, the electrical conducting bars of identical potential may be connected to one another using integral U-shaped conducting means 141, 143.

Figure 13:
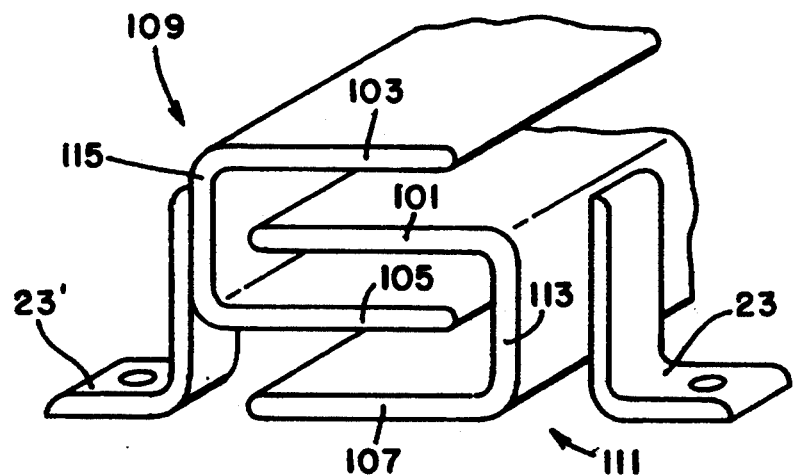
FIG. 13 depicts a partial isometric view of an alternative embodiment of a bus bar assembly having two complimentary C-shaped conducting means shown without the dielectric insulating material therebetween for clarity.

Referring now to FIG. 13, an alternative embodiment of the bus bar assembly constructed in accordance with the principles of the present invention is shown. This bus bar assembly includes a pair of C-shaped conducting means 109, 111, oriented in a complimentary position such that the first conducting bar 101 of the first C-shaped conducting means 111 is located in between a second conducting bar 103 and a third conducting bar 105 forming the second C-shaped conducting means 109. The first C-shaped conducting means 111 has two conducting bars. A first conducting bar 101, and a fourth conducting bar 107 connected by a perpendicular section 113 extending throughout the length of the conducting bars 101, 107 to form the first C-shaped conducting means which is operated at a first electric potential. The second C-shaped conducting means 109 is operated at a second electric potential and is formed by two additional conducting bars 103, 105 and a perpendicular section 115 extending throughout the length of the conducting bars 103, 105 integrally connected to the conducting bars 103, 105. Connecting feet 23, 23' may be affixed to substantially perpendicular sections 113, 115 of each of the C-shaped conducting means to support the bus bar assembly in affixed position. A dielectric insulating material (which is not shown in FIG. 13) must be located between each of the C-shaped conducting means. For example, between the conducting 103, and conducting bar 101 being at a different electric potential dielectric insulating material is located. Also, between conducting bar 101 and conducting bar 105 being at a different electric potential dielectric insulating material is located. Between conducting bars 105 and 107 being of a different electric potential dielectric insulating material is also located. The dielectric insulating material must also be located between perpendicular section 115 and conducting bar 101 and between conducting bar 105 and perpendicular connecting means 103.

Figure 14:
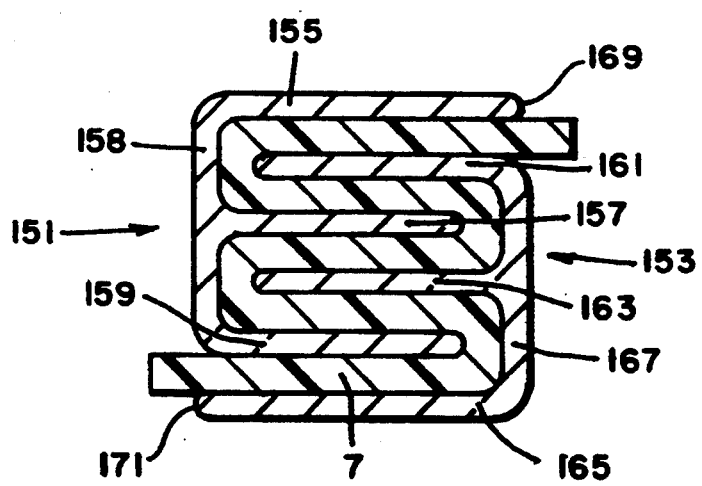
FIG. 14 depicts a partial cross section view of an alternative embodiment of a bus bar assembly having two complimentary E-shaped conducting means.

FIG. 14 depicts a cross-sectional view of yet another embodiment of the bus bar assembly constructed in accordance with the principles of the present invention. The bus bar assembly contains a first E-shaped conducting means 151 having three elongate conducting bars 155, 157, 159 connected to a perpendicular section 158 of the E-shaped conducting means 151. A second E-shaped conducting means 153 also having three conducting bars 161, 163, 165 connected to a perpendicular section 167 is positioned in a complimentary position to the first E-shaped conducting means 151. Conducting bar 159 of the first E-shaped conducting means 151 is located in between two conducting bars 165, 163 of the second E-shaped conducting means 153. Conducting bar 157 of the first E-shaped conducting means 151 is located in between conducting bar 163 and conducting bar 161 of the second E-shaped conducting means 153. Conducting bar 161 of the second E-shaped conducting means 153 is located in between conducting bar 157 of the first E-shaped conducting means 151 and conducting bar 155 of the first E-shaped conducting means 151. Conducting bar 155 may have the outermost portion thereof 169 extending substantially even with the outer face of perpendicular section 167 of the second E-shaped conducting means 153. Also, conducting bar 165 of the second E-shaped conducting means 153 may have the outer portion thereof 171 extending substantially even with the outer face of perpendicular section 158 of the first E-shaped conducting means 151. Dielectric insulating material 7 is placed between the first and second E-shaped conducting means to separate conductive portions of each E-shaped conducting means being at unequal potential. Each E-shaped conducting means may be supported by one or more connecting feet in the same manner as depicted in FIG. 13.

Although the invention has been described in connection with the embodiments depicted herein, it is apparent to one skilled in the art that various modifications and substitutions may be made to such embodiments without departing from the scope of the invention as defined in the following claims.

What is claimed is:

1. A low inductance bus bar arrangement comprising:
   two or more elongate electrical conducting bars having rounded edges thereon;
   one or more strips of dielectric insulating material, each strip of dielectric insulating material being located between two of said elongate electrical conducting bars, said strips of dielectric insulating material having a height and length being greater than the height and length, respectively of said elongate electrical conducting bars.

2. The low inductance bus bar of claim 1 wherein the electrical conducting bars have their height substantially vertically oriented.

3. A low inductance bus bar arrangement comprising:
   two or more elongate electrical conducting bars having rounded edges thereon;
   one or more strips of dielectric insulating material, each strip of dielectric insulating material being located between two of said elongate electrical conducting bars, said strips of dielectric insulating material having a height and length being greater than the height of said elongate electrical conducting bars; and
   apertures extending through the electrical conducting bars and strips of dielectric insulating material wherein said conducting bars and strips are held together using a fastening means extending through the apertures.

4. A low inductance bus bar arrangement comprising:
   two or more elongate electrical conducting bars having rounded edges thereon and having their height substantially vertically oriented;
   one or more strips of dielectric insulating material, each strip of dielectric insulating material being located between two of said elongate electrical conducting bars, said strips of dielectric insulating material having a height and length being greater than the height of said elongate electrical conducting bars; and
   a connecting foot affixed to each of said conducting bars by a fastener inserted through an aperture within a conducting bar, said fastener having a head being recessed within the aperture of the conducting bar and protruding through said aperture and through a coaxial aperture within the connecting foot.

5. The low inductance bus bar arrangement of claim 4 wherein the fastener head contains rounded edges.

6. The low inductance bus bar arrangement of claim 5 comprising more than one connecting foot.

7. The low inductance bus bar arrangement of claim 6 wherein a first connecting foot connected to one of said conducting bars is electrically connected to a first switching power device, and a second connecting foot connected to another of said conducting bars is connected to a second switching power device, said switching power devices each having a collector contact point and emitter contact point said switching power devices being oriented wherein a direct line extending directly between the emitter contact point of the first switching power device and the collector contact point of the second switching power device is substantially perpendicular to the conducting bars.

8. The low inductance bus bar arrangement of claim 7 comprising at least three elongate electrical conducting bars, two of said electrical conducting bars being at the same electrical potential and being connected to each other by a U-shaped conducting means integrally formed to said two of said electrical conducting bars wherein a connecting foot is affixed to said U-shaped conducting means.

9. The low inductance bus bar arrangement of claim 8 further comprising dielectric insulating material located between the U-shaped conducting means and another one of said at least three conducting bars.

10. The low inductance bus bar of claim 4, wherein said fastener is made of a plastic material.

11. The low inductance bus bar of claim 8 wherein the connecting foot is affixed by a fastener to the U-shaped conducting means.

12. The low inductance bus bar of claim 11 wherein the fastener is recessed into the U-shaped conducting means.

13. A low inductance bus bar assembly comprising:
a pair of elongate electrical conducting bars having rounded edges, said bars being embedded within and separated by a thermoplastic dielectric resin insulating material throughout their entire length.

14. A low inductance bus bar assembly comprising:
a pair of elongate electric conducting bars having rounded edges, said bars being embedded within the separated by a thermoplastic dielectric resin insulating material, wherein a screw terminal is located within the thermoplastic dielectric resin, said screw terminal comprising a threaded aperture within said resin, said threaded aperture being coaxial with and extending into an identically threaded aperture within one of said pair of elongate electrical conducting bars.

15. A low inductance bus bar arrangement comprising:
at least three elongate electrical conducting bars having rounded edges thereon, a first of said conducting bars being oriented between and parallel to a second and third conducting bars being of similar electric potential and being connected at the same end by a substantially perpendicular section integrally formed with the second and third conducting bars thereby forming a C-shaped conducting means; and
one or more strips of dielectric insulating material, each strip of dielectric insulating material being located between two of said elongate electrical conducting bars, said strips of dielectric insulating material having a height and length being greater than the height of said elongate electrical conducting bars.

16. The low inductance bus bar of claim 15 wherein the first conducting bar being oriented between and parallel to the second and third conducting bars is connected to a fourth conducting bar by an integrally formed substantially perpendicular section, said fourth conducting bar being substantially parallel to said second and third conducting bars, wherein said first and fourth conducting bars and said perpendicular section integrally formed therewith form a C-shaped conducting means.

17. The low inductance bus bar arrangement of claim 16 further comprising a fifth elongate conducting bar being substantially parallel to the second conducting bar and being connected thereto by a perpendicular section integrally formed with the second and fifth conducting bars, wherein said second, third and fifth conducting bars and perpendicular sections integrally formed therewith form a first E-shaped conducting means.

18. The low inductance bus bar arrangement of claim 17 further comprising a sixth elongate conducting bar being substantially parallel to the first conducting bar and being connected thereto by a perpendicular conducting section integrally formed with the sixth and first conducting bars, wherein said sixth, first and fourth conducting bars and perpendicular sections formed therewith form a second C-shaped conducting means which is oppositely opposed and oriented complimentary to the first E-shaped conducting means.

19. The low inductance bus bar arrangement of claim 18 wherein the edge of the fifth conducting bar opposite the perpendicular conducting section integrally formed thereto is approximately even with an outer face of the second E-shaped conducting means.

20. The low inductance bus bar arrangement of claim 19 wherein the edge of the fourth conducting bar opposite the perpendicular conducting section integrally formed thereto is approximately even with an outer face of the first E-shaped conducting means.

21. A low inductance bus bar assembly comprising: more than two elongate electrical conducting bars, said bars having rounded edges, said bars being embedded within and separated by a thermoplastic dielectric resin insulating material, wherein a pair of said electrical conducting bars being at the same electric potential are connected to each other by a U-shaped conducting means integrally formed to said pair of electrical conducting bars.

22. The low inductance bus bar assembly of claim 21 wherein a connecting foot is affixed to said U-shaped conducting means.

23. The low inductance bus bar assembly of claim 22 further comprising a second pair of conducting bars being at a potential different than said prior pair of conducting bars and being connected to each other by a U-shaped conducting means integrally formed to said pair of electrical conducting bars.

24. The low inductance bus bar assembly of claim 23 further comprising a connecting foot affixed to said second pair of U-shaped conducting means connecting said second pair of conducting bars.

25. The low inductance bus bar arrangement of claim 24 wherein said elongate electrical conducting bars are surrounded by a casing.

* * * * *

UNITED STATES PATENT AND TRADEMARK OFFICE
CERTIFICATE OF CORRECTION

PATENT NO. : 5,422,440
DATED : Jun. 6, 1995
INVENTOR(S) : Palma

It is certified that error appears in the above-indentified patent and that said Letters Patent is hereby corrected as shown below:

On the title page:
In Item [75] Inventor Rudolfo Palma should be --Rodolfo Palma--.

Column 9, claim 14, line 29, "electric" should be --electrical--.
Column 9, claim 14, line 31, "the" should be --and--.

Signed and Sealed this

Fifth Day of September, 1995

Attest:

BRUCE LEHMAN

Attesting Officer

Commissioner of Patents and Trademarks